United States Patent [19]
Schindler

[11] Patent Number: 6,104,215
[45] Date of Patent: Aug. 15, 2000

[54] SIGNAL DETECTOR WITH IMPROVED NOISE IMMUNITY

[75] Inventor: Frederick R. Schindler, Sunnyvale, Calif.

[73] Assignee: Sun Microsystems, Inc., Palo Alto, Calif.

[21] Appl. No.: 09/139,956

[22] Filed: Aug. 25, 1998

[51] Int. Cl.$^7$ .................................................. G01R 29/02
[52] U.S. Cl. ................................................ 327/34; 327/217
[58] Field of Search .................................. 327/24, 26, 27, 327/33, 34, 35, 36, 37, 47, 48

[56] References Cited

U.S. PATENT DOCUMENTS

| | | | |
|---|---|---|---|
| 5,225,715 | 7/1993 | Mori et al. | 307/265 |
| 5,317,215 | 5/1994 | Kranzler | 307/517 |
| 5,646,565 | 7/1997 | Tulidate | 327/174 |
| 5,826,061 | 10/1998 | Walp | 395/500 |

OTHER PUBLICATIONS

"Pulse discriminator excises narrow pulses", by Mark Vitunic, EDN, p. 102, Nov. 20, 1997.

*Primary Examiner*—Terry D. Cunningham
*Assistant Examiner*—Quan Tra
*Attorney, Agent, or Firm*—Sierra Patent Group, Ltd.

[57] ABSTRACT

A method for processing a signal transitioning from a high state to a low state is described, comprising the steps of detecting a transition of the signal from a high state to a low state, setting a timer for a predetermined interval, sampling, while the timer is running, the signal to determine whether the signal remains in a low state, determining, by reading the timer, whether the predetermined interval has elapsed, repeating the sampling and determining steps until the predetermined interval has elapsed; and concluding, if the signal remains in a low state for each instance of said sampling step, that the transition is valid.

7 Claims, 4 Drawing Sheets

SIGNAL DETECTOR WITH IMPROVED NOISE IMMUNITY

BACKGROUND OF THE INVENTION

1. Field of the Invention

The present invention relates to integrated circuits. More particularly, the present invention relates to a method and apparatus for determining if a signal has transitioned to a new logic state.

2. The Background Art

Signals used in digital electronics are typically characterized by whether they are high (a binary "1"), or low (a binary "0"). In addition to knowing whether a signal is high or low, it is also important to know when a signal has made a transition from high to low, or from low to high.

As higher speed electronics has been developed, the effects of noise on the operation of digital circuits have become more pronounced. This is because modern digital circuits respond to higher frequency signals than in the past. As a result, the bandwidth of the circuits has increased, thus allowing more signal noise to affect circuit operation. Bad effects can be seen, for instance, when a noise spike is incorrectly determined by electronic circuitry to be a transition from low to high, or from high to low.

A noise spike which is incorrectly determined by a microprocessor to be an interrupt can cause a number of things to occur. At best, the interrupt may cause the system containing the microprocessor to operate less efficiently than otherwise would be seen. At worst, a false interrupt could cause the system to reset during a critical time period, thus causing the loss of data, the loss of operation of the system, or other catastrophic effects. It would therefore be beneficial to provide a method and apparatus which detects signal transitions from one state to another, with significantly reduced errors caused by system noise.

For conventional, non-microprocessor based circuits, a noise spike may cause anything from an undesired latch state, to circuit faults which require reinitialization of the entire system. It would therefore be beneficial to provide a method and apparatus which could be included in systems having conventional integrated circuits, and would have significantly reduced errors resulting from system noise.

OBJECTS AND ADVANTAGES OF THE INVENTION

It is an object and advantage of the present invention to provide a method and apparatus for detecting signal transitions.

It is a further object and advantage of the present invention to provide an apparatus which significantly reduces the effect of noise on the detection of signal transitions.

SUMMARY OF THE INVENTION

A method for processing a signal transitioning from a high state to a low state is described, comprising the steps of detecting a transition of the signal from a high state to a low state, setting a timer for a predetermined interval, sampling, while the timer is running, the signal to determine whether the signal remains in a low state, determining, by reading the timer, whether the predetermined interval has elapsed, repeating the sampling and determining steps until the predetermined interval has elapsed; and concluding, if the signal remains in a low state for each instance of said sampling step, that the transition is valid.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
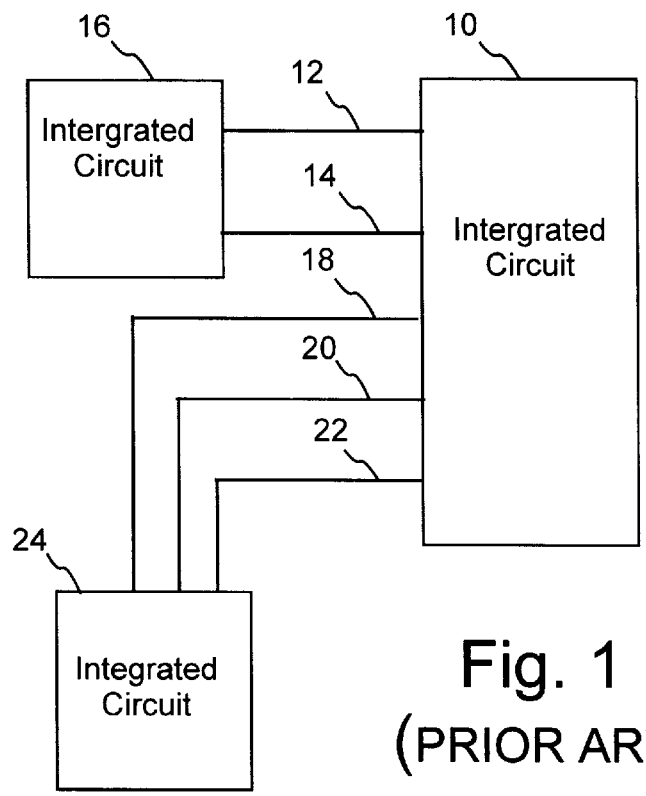
FIG. 1 is a block diagram of a conventional integrated circuit.

FIG. 1 is a block diagram of a conventional integrated circuit.

Referring to FIG. 1, a conventional integrated circuit 10 is shown having signal inputs 12 and 14 leading from integrated circuit 16, and signal inputs 18, 20, and 22, leading from integrated circuit 24. Other integrated circuits and discrete logic may be present, as is known to those of ordinary skill in the art.

Integrated circuits 10, 16, and 24 may be any integrated circuit, such as a microprocessor, a flip-flop, or an application-specific integrated circuit (ASIC). In noisy environments, signal inputs 12, 14, 18, 20, and 22 may act as antennas, or may inductively or capacitively couple with other traces, thus picking up noise spikes, and possibly transmitting those spikes to the internal circuitry of integrated circuit 10. If these noise spikes are of sufficient voltage and duration, they may trigger unintended events within integrated circuit 10 which would not otherwise occurred in the normal operation of the system containing integrated circuit 10.

Figure 2:
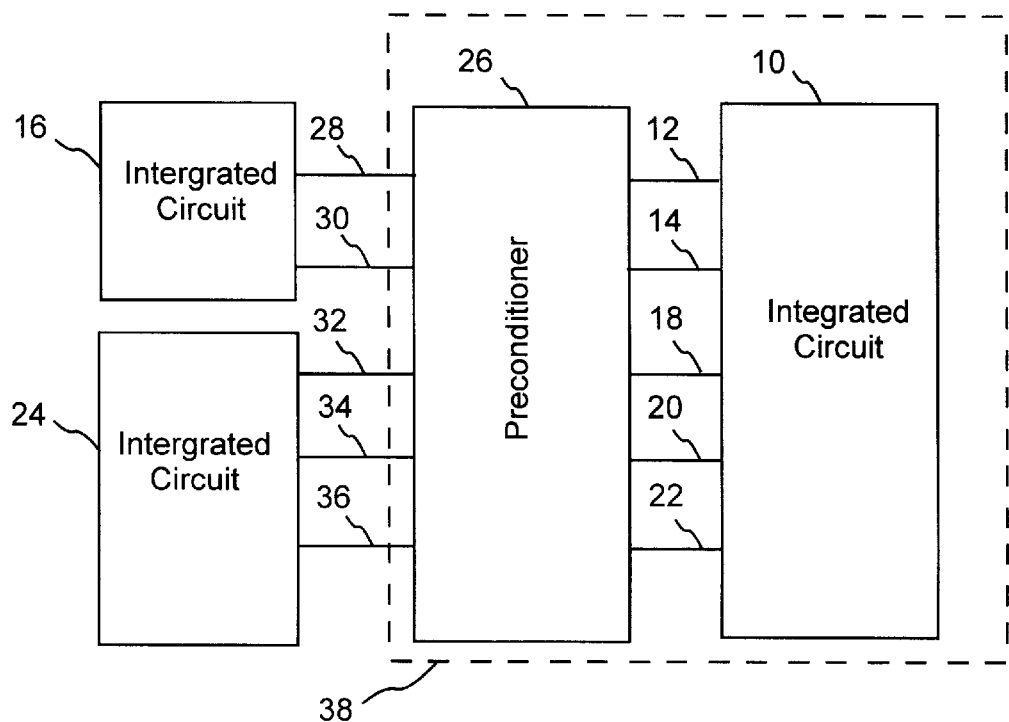
FIG. 2 is a block diagram of a presently preferred embodiment of the present invention.

FIG. 2 is a block diagram of a presently preferred embodiment of the present invention.

Referring to FIG. 2, integrated circuit 10 is seen having the same signal inputs 12, 14, 18, 20, and 22 but these signal inputs, instead of coming from integrated circuits 16 and 24 as before, come from preconditioner 26. Preconditioner 26 acts, as will be described later, to determine whether an interrupt is continuously asserted for a predetermined time interval in order to ensure that the interrupt is valid, rather than being the result of a noise spike. In a presently preferred embodiment of the present invention. For example Preconditioner 26 samples signal input line 32 periodically to determine if a signal transition from low to high, or from high to low, takes place. Preconditioner includes a sampler 33 which receives inputs 28, 30, 32, 34 and 36. Sampler 33 determines when a signal transitions from a first logic state to a second logic state occurs. Sampler 33 may include a transition detector 31 for detecting the signal transition. Sampler 33 generates outputs which are communicated to timer 35.

Timer 35 has inputs which are coupled to the sampler 33. The timer 35 is activated when the sampler indicates a transition from the first logic state to the second logic state. The timer 35 provides an output indicating when a predetermined time period has elapsed following the signal from the first state to the second state.

A determiner 37 has a first input and a second input and an output. The first input determiner 37 is coupled to the output of the sampler 33. The second input of determiner 37 is coupled to the output of timer 35. The determiner 37 asserts valid signals 12, 14, 18, 20, and 22 at the output of the determiner when the valid signals have remained in the second logic state for the duration of the predetermined time period. When a transition is detected on input line 32, preconditioner 26 continues to sample input line 32 for a predetermined number of clock cycles. If input line 32 remains in an asserted state for the predetermined number of clock cycles, the signal transition is deemed valid, and the corresponding input line 18, is asserted. Those of ordinary skill in the art shall appreciated that a timer 35 which remains in an asserted state for a predetermined number of cycles is well known in the art of digital design. As will be appreciated by those skilled in the art, the predetermined number of cycles for the timer circuit will depend on the input signal being sampled from the integrated circuits 16 and 24. This method will be described in more detail later.

Those of ordinary skill in the art will readily recognize that preconditioner 26 may be implemented as discrete logic, as a programmable logic, device , as an ASIC, or as part of a larger integrated circuit, such as an integrated circuit 38 which comprises the separate functions of integrated circuit 10 and integrated circuit 26.

Figure 3:
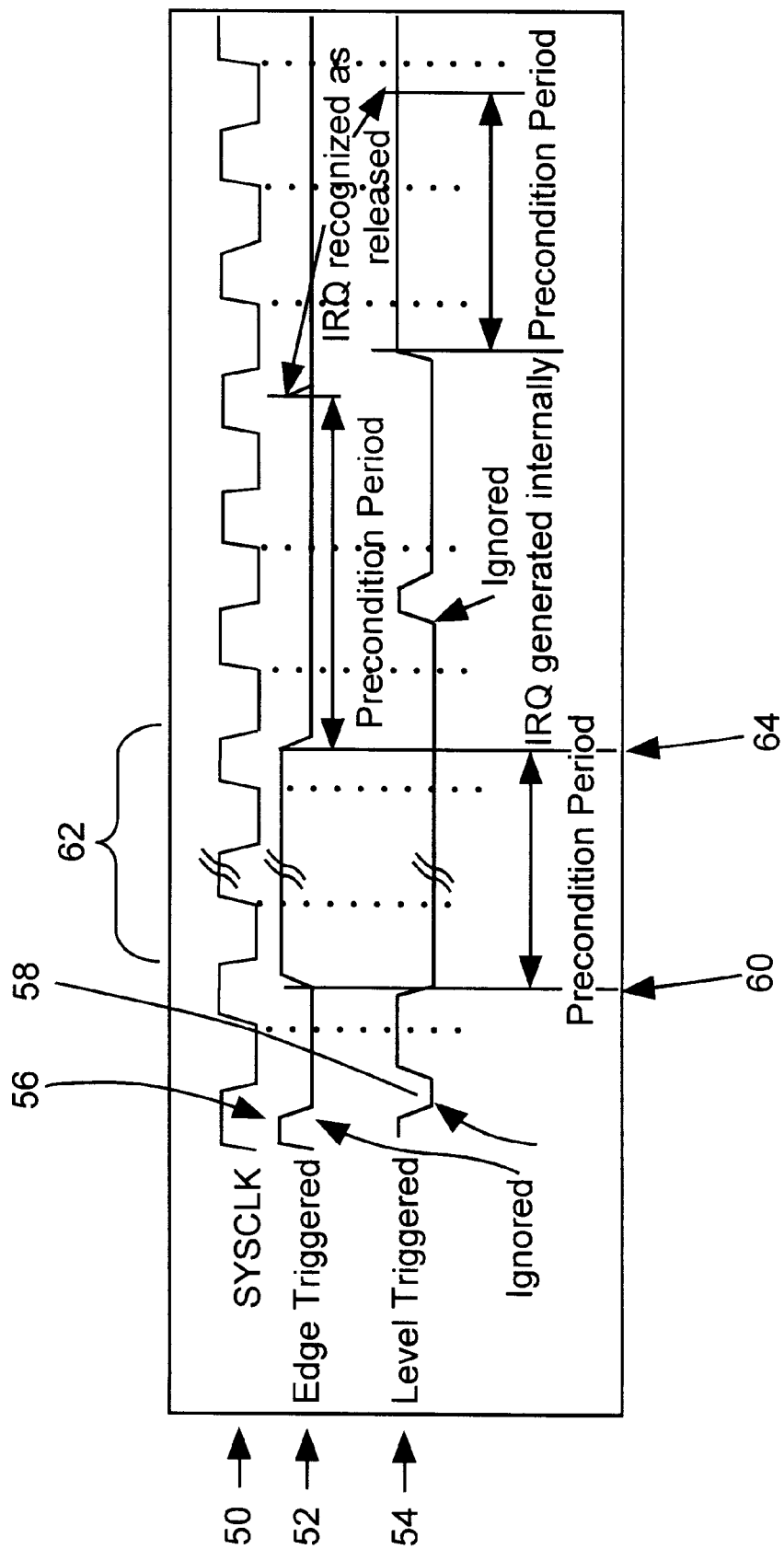
FIG. 3 is a signal transition chart showing signal transitions as they are operated upon by the present invention.

FIG. 3 is a signal transition chart showing signal transitions as they are operated upon by the present invention.

Referring to FIG. 3, clock signal 50, edge triggered interrupt 52, and level-triggered interrupt 54 are shown.

Clock signal 50 is preferably a system clock signal, but may be any periodic reference within the system.

As can be seen from FIG. 3, a signal must be transition from one state to another, and then hold that state for a predetermined number of clock cycles, in order for that new state to be recognized as valid. Thus, transitions high or low which persist for less time than the predetermined time period, such as transitions 56 and 58 of FIG. 3, will be ignored by preconditioner 26 of FIG. 2.

As can be further seen in FIG. 3, edge-triggered interrupt 52 and level-triggered interrupt 54 each make transitions at time 60. Both signals remain asserted for a time span 62, and the respective transitions are considered valid as of time 64.

Figure 4:
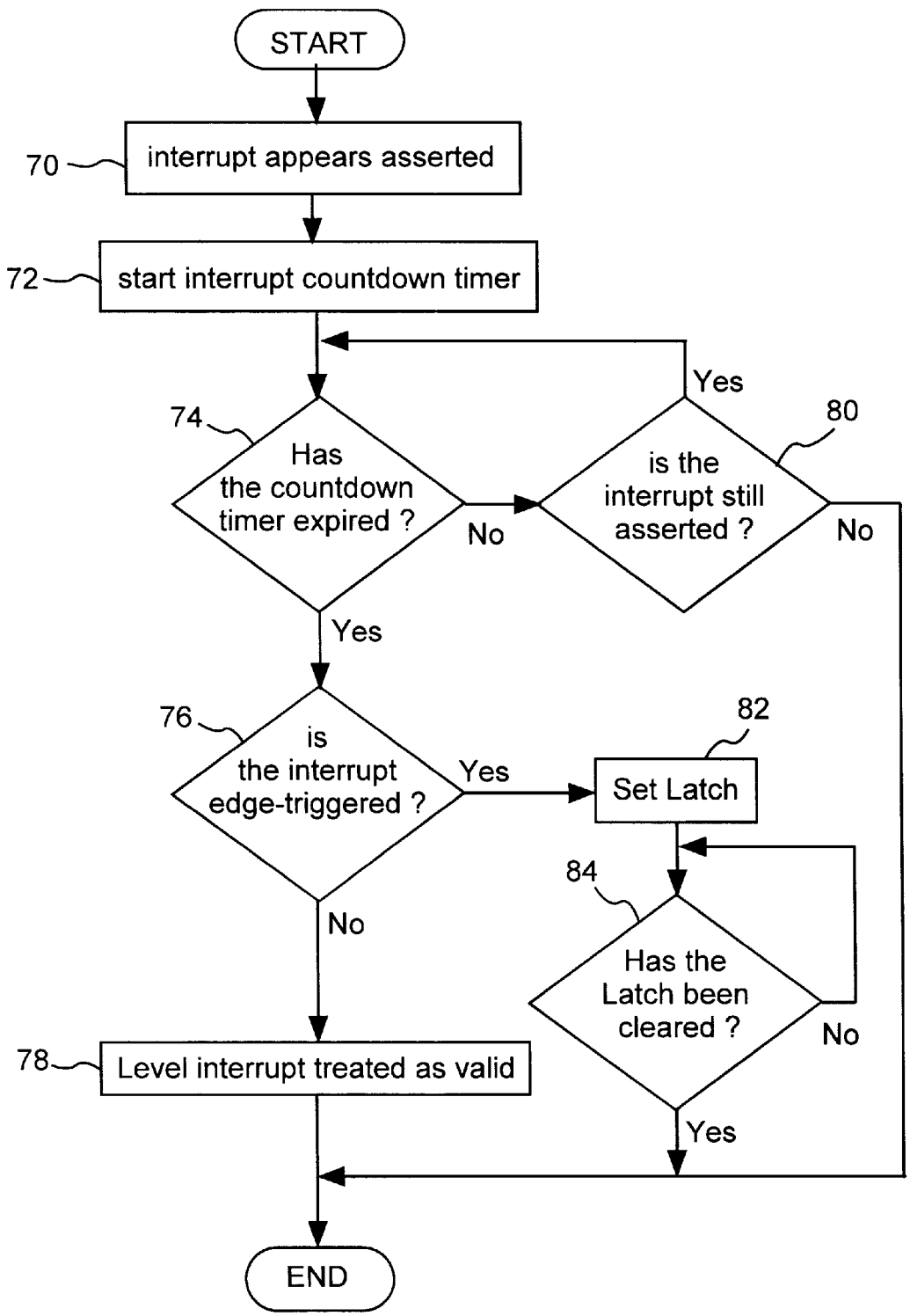
FIG. 4 is a flow chart depicting steps in a preferred method of the present invention.

FIG. 4 is a flow chart depicting steps in a preferred method of the present invention.

Referring to FIG. 4, a preferred method of the present invention begins at step 70 where a signal input line is determined to be in an asserted condition. This condition, as is known to those of ordinary skill in the art, may be a high state, or a low state.

At step 72, a countdown timer is set in order to count down from a predetermined time interval to zero. Alternatively, a counter may be started from zero which counts system clock transitions.

At step 74, it is determined whether the countdown timer set at step 72 has expired by counting down to zero. If the alternative counter is used, it is determined if the clock has counted up to a predetermined value.

If, at step 74, the countdown timer has counted to zero, or the alternative counter has counted up to a predetermined value, the method proceeds with step 76 where it is determined whether the signal input being examined is an edge triggered interrupt. If no, the method proceeds with step 78 at which time the interrupt is treated as valid, and passed along to integrated circuit 10 by preconditioner 26, both of FIG. 2.

If, at step 74, it is determined that the countdown timer has not counted to zero, i.e. expired, the method of the present invention proceeds with step 80 during which it is determined whether the interrupt is sill asserted. If yes, the method proceeds with step 74 again. If the interrupt is no longer asserted, the method terminates, since the interrupt was not asserted for long enough to be considered valid.

If, at step 76, the interrupt being examined is an edge-triggered interrupt, the method proceeds with step 82 during which a latch is set within preconditioner 26 which represents the edge-triggered interrupt to integrated circuit 10. The method then proceeds with step 84, which runs continuously until the latch is reset by the system, showing that the interrupt has been recognized. Once the latch is cleared, the method terminates.

Figure 5:
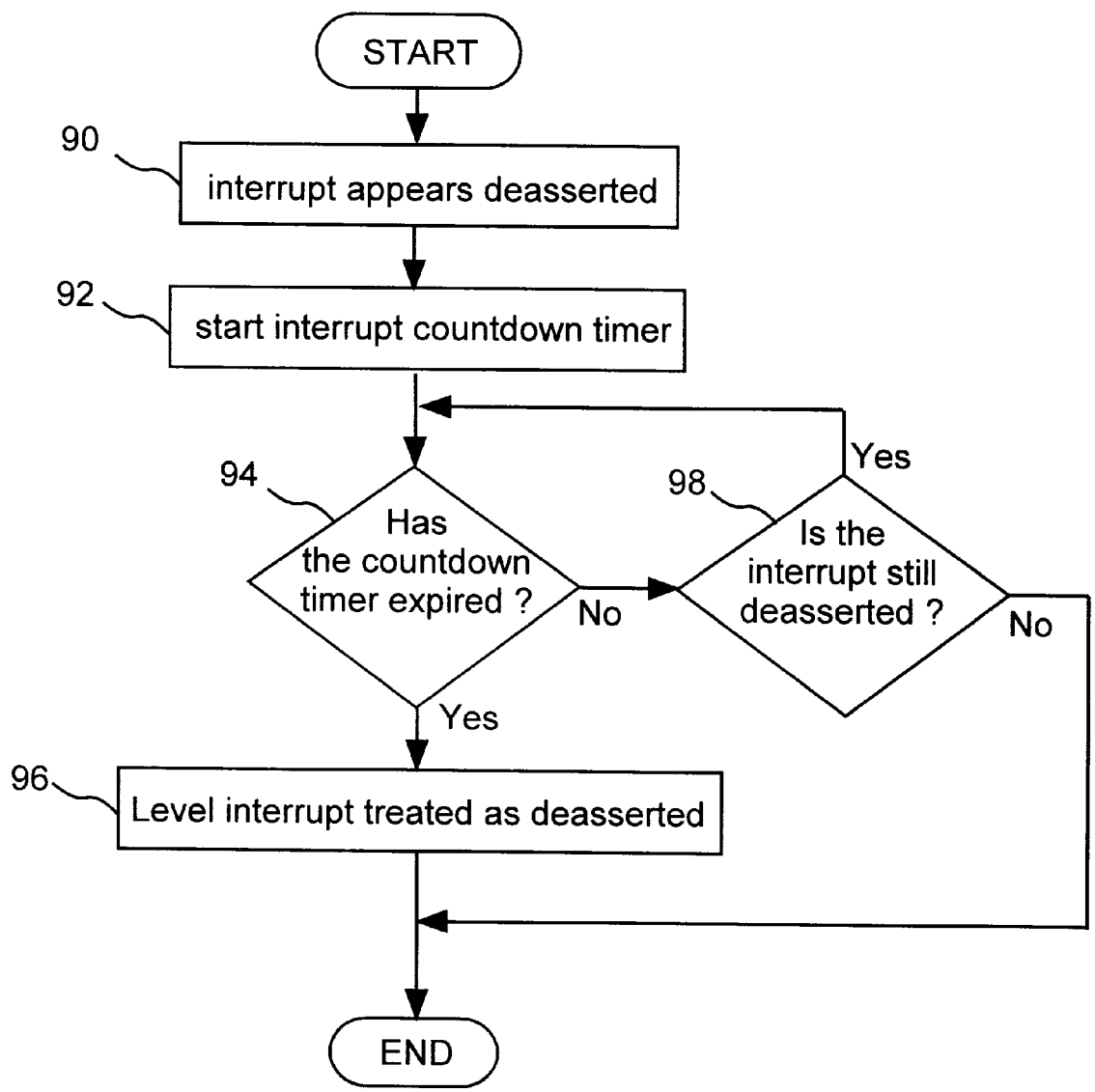
FIG. 5 is a flow chart depicting steps in a second preferred method of the present invention.
Figure 2:
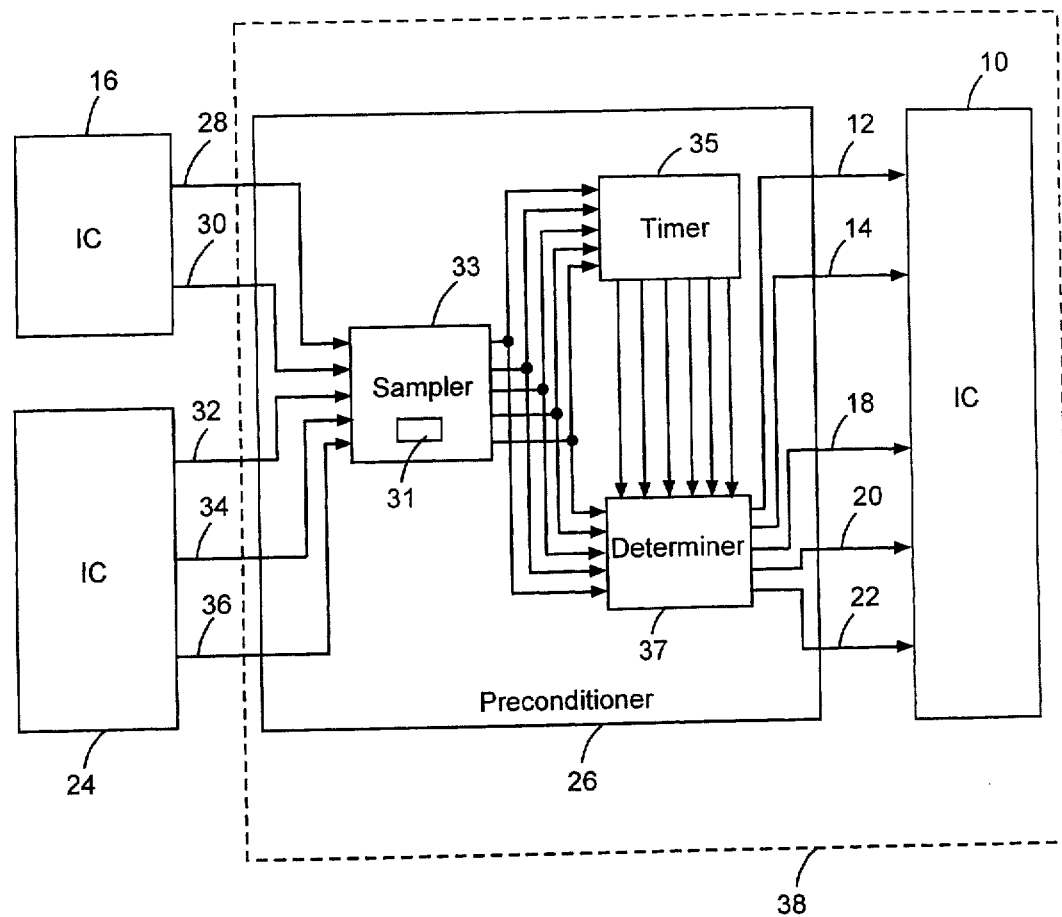

FIG. 5 is a flow chart depicting steps in a second preferred method of the present invention.

In this method, the examination of a level interrupt is undertaken in order to ensure that the interrupt is deasserted for long enough to be considered valid. It is contemplated by the inventor that this method will most often be used together with the previously described method of FIG. 4. However, either method may be used, together or separately, depending on the requirements of the particular system.

Referring to FIG. 5, at step 90 the interrupt is recognized as being in a deasserted state, either from noise, or because of a real condition of the system.

At step 92, a countdown timer is set. Again, a time which counts down from some predetermined value is just as good as one which starts at zero and counts upward to a predetermined count. Further, the same timer as used at FIG. 4 step 74 may or may not be used, at the discretion of the designer, without departing from the inventive concepts described herein.

At step 94, it is determined whether the countdown timer set at step 92 has expired by counting down to zero. If the alternative counter is used, it is determined if the clock has counted up to a predetermined value.

If, at step 94, the countdown timer has counted to zero, or the alternative counter has counted up to a predetermined value, the method proceeds with step 96 at which time the interrupt is treated as deasserted, and passed along as such to integrated circuit 10 by preconditioner 26, both of FIG. 2.

If, at step 94, it is determined that the countdown timer has not counted to zero, i.e. expired, the method of the present invention proceeds with step 98 during which it is determined whether the interrupt is sill deasserted. If yes, the method proceeds with step 94 again. If the interrupt is no longer asserted, the method terminates, since the interrupt was not asserted for long enough to be considered valid.

Those of ordinary skill in the art will readily recognize that, although a microprocessor interrupt is used herein as an example of the type of signal which may be processed using the present invention, virtually any digital signal which transitions between a high state and a low stats may be processed by the present invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for processing a signal transitioning from a high state to a low state comprising:

a. providing a first integrated circuit having at least one input and at least one output and a second integrated circuit having at least one input and at least one output;

b. providing a preconditioner configured to remove high frequency noise, said preconditioner coupled between said at least one first integrated circuit output and said at least one second integrated circuit input;

c. detecting a transition of the signal from a high state to a low state in said preconditioner from said at least one output from said first integrated circuit;

d. setting a timer for a predetermined interval;

e. sampling, while said timer is running, the signal to determine whether the signal remains in the low state throughout said predetermined time period;

f. determining, by reading said timer, whether said predetermined interval has elapsed;

g. repeating said sampling of the signal and said determining whether said predetermined interval has elapsed until said predetermined interval has elapsed;

h. concluding, if the signal remains in a low state for each instance of said sampling of the signal, that the transition is a valid signal; and i. communicating said valid signal to said second integrated circuit.

2. The method of claim 1 wherein said setting said timer is accomplished by setting said timer to a value, and causing said value to count down to zero.

3. The method of claim 1 wherein said setting said timer is accomplished by setting said timer to a zero value, and causing said value to count up to a predetermined value.

4. A method for processing a signal transitioning from a low state to a high state comprising:

a. providing a first integrated circuit having at least one input and at least one output and a second integrated circuit having at least one input and at least one output;

b. providing a preconditioner configured to remove high frequency noise, said preconditioner coupled between said at least one first integrated circuit output and said at least one second integrated circuit input;

c. detecting a transition of the signal from a low state to a high state in said preconditioner from said at least one output from said first integrated circuit;

d. setting a timer for a predetermined interval;

e. sampling, while said timer is running, the signal to determine whether the signal remains in the high state throughout said predetermined time period;

f. determining, by reading said timer, whether said predetermined interval has elapsed;

g. repeating said sampling of the signal and said determining whether said predetermined interval has elapsed until said predetermined interval has elapsed;

h. concluding, if the signal remains in a high state for each instance of said sampling of the signal, that the transition is a valid signal; and i. communicating said valid signal to said second integrated circuit.

5. The method of claim 4 wherein said setting said timer is accomplished by setting said timer to a value, and causing said value to count down to zero.

6. The method of claim 4 wherein said setting said timer is accomplished by setting said timer to a zero value, and causing said value to count up to a predetermined value.

7. An apparatus for signal detection with improved noise immunity, comprising:

a first integrated circuit having at least one input and at least one output;

a second integrated circuit having at least one input and at least one output;

a preconditioner configured to remove high frequency noise, said preconditioner coupled between said at least one first integrated circuit output and said at least one second integrated circuit input;

a sampler within said preconditioner having an input and an output, said input of said sampler being coupled to the source of said signal, said sampler providing an output whenever said signal transitions from the first logic state to the second logic state;

a timer within said preconditioner having an input and an output, said input of said timer being coupled to said output of said sampler, wherein said timer is activated when said sampler indicates a transition from said first logic state to said second logic state has occurred, and wherein said timer provides an output indicating when a predetermined time period has elapsed following said signal transitioning from said first state to said second state; and a determiner within said preconditioner having first and second inputs, and an output, wherein said first input of said determiner is coupled to said output of said sampler, and said second input of said determiner is coupled to said output of said timer, wherein said determiner asserts a signal at said output of said determiner when said signal has remained in said second logic state for the duration of said predetermined time period.

* * * * *

UNITED STATES PATENT AND TRADEMARK OFFICE
CERTIFICATE OF CORRECTION

PATENT NO. : 6,104,215
DATED : August 15, 2000
INVENTOR(S) : Frederick R. Schindler It is certified that error appears in the above-identified patent and that said Letters Patent is hereby corrected as shown below:

Col. 1, Line 17, replace "has" with --have--.
Col. 3, Line 8, a new paragraph starts with "When a transition".

Please replace Figure 2 with the enclosed formal drawing of revised Figure 2.

Signed and Sealed this

Twenty-fourth Day of April, 2001

Attest:

NICHOLAS P. GODICI

Attesting Officer

Acting Director of the United States Patent and Trademark Office